(12) United States Patent
Kwan et al.

(10) Patent No.: US 11,522,077 B2
(45) Date of Patent: Dec. 6, 2022

(54) INTEGRATION OF P-CHANNEL AND N-CHANNEL E-FET III-V DEVICES WITH OPTIMIZATION OF DEVICE PERFORMANCE

(71) Applicant: Taiwan Semiconductor Manufacturing Co., Ltd., Hsin-Chu (TW)

(72) Inventors: Man-Ho Kwan, Hsin-Chu (TW); Fu-Wei Yao, Hsinchu (TW); Chun Lin Tsai, Hsin-Chu (TW); Jiun-Lei Jerry Yu, Zhudong Township (TW); Ting-Fu Chang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 162 days.

(21) Appl. No.: 16/884,398

(22) Filed: May 27, 2020

(65) Prior Publication Data
US 2021/0376135 A1  Dec. 2, 2021

(51) Int. Cl.
*H01L 29/778* (2006.01)
*H01L 29/20* (2006.01)
(Continued)

(52) U.S. Cl.
CPC ...... *H01L 29/7783* (2013.01); *H01L 29/1041* (2013.01); *H01L 29/2003* (2013.01); *H01L 29/66462* (2013.01)

(58) Field of Classification Search
CPC ... H01L 29/122–127; H01L 29/15–158; H01L 29/7783; H01L 29/1041; H01L 29/2003; H01L 29/66462; H01L 29/66431; H01L 29/1066; H01L 29/4236; H01L 29/7786; H01L 29/778–7789; H01L 27/04; H01L 27/0605; H01L 27/085;
(Continued)

(56) References Cited

U.S. PATENT DOCUMENTS

| 4,663,643 A | * | 5/1987 | Mimura | H01L 29/7787 257/E27.068 |
| 7,199,014 B2 | * | 4/2007 | Anda | H01L 29/66462 438/285 |

(Continued)

FOREIGN PATENT DOCUMENTS

TW   202018943 A   5/2020

*Primary Examiner* — Natalia A Gondarenko
(74) *Attorney, Agent, or Firm* — Eschweiler & Potashnik, LLC

(57) ABSTRACT

Various embodiments of the present disclosure are directed towards an integrated chip a first undoped layer overlies a substrate. A first barrier layer overlies the first undoped layer and has a first thickness. A first doped layer overlies the first barrier layer and is disposed laterally within an n-channel device region of the substrate. A second barrier layer overlies the first barrier layer and is disposed within a p-channel device region that is laterally adjacent to the n-channel device region. The second barrier layer has a second thickness that is greater than the first thickness. A second undoped layer overlies the second barrier layer. A second doped layer overlies the second undoped layer. The second undoped layer and the second doped layer are disposed within the p-channel device region.

20 Claims, 7 Drawing Sheets

(51) Int. Cl.
*H01L 29/66* (2006.01)
*H01L 29/10* (2006.01)

(58) Field of Classification Search
CPC ... H01L 27/0922; H01L 27/095; H01L 27/10;
H01L 21/0475; H01L 21/02636; H01L
21/2003; H01L 21/2036; H01L 21/2018;
H01L 21/2056; H01L 21/2085; H01L
21/2253; H01L 21/28562; H01L
21/28575; H01L 21/8232; H01L 21/8238;
H01L 21/823828; H01L 21/82385; H01L
21/823857; H01L 21/823871; H01L
2924/13064; H01L 25/0655; H01L 25/072
USPC ................ 257/76, 77, 194, 29.104
See application file for complete search history.

(56) References Cited

U.S. PATENT DOCUMENTS

| | | | |
|---|---|---|---|
| 9,559,012 B1* | 1/2017 | Chu | H01L 29/7787 |
| 2007/0158683 A1* | 7/2007 | Sheppard | H01L 21/046 |
| | | | 257/E21.057 |
| 2008/0070355 A1* | 3/2008 | Lochtefeld | H01L 21/8258 |
| | | | 257/E27.012 |
| 2011/0024798 A1 | 2/2011 | Tamari et al. | |
| 2012/0097919 A1* | 4/2012 | Speck | H01L 33/16 |
| | | | 257/E29.089 |
| 2013/0026489 A1* | 1/2013 | Gambin | H01L 29/66462 |
| | | | 257/77 |
| 2015/0041820 A1* | 2/2015 | Renaud | H01L 21/8252 |
| | | | 438/172 |

* cited by examiner

INTEGRATION OF P-CHANNEL AND N-CHANNEL E-FET III-V DEVICES WITH OPTIMIZATION OF DEVICE PERFORMANCE

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. Thus, high electron mobility transistor (HEMT) devices have been receiving increased attention due to high electron mobility and wide band gaps compared to silicon-based semiconductor devices. Such high electron mobility and wide band gaps allow improved performance (e.g., fast switching speeds, low noise) and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
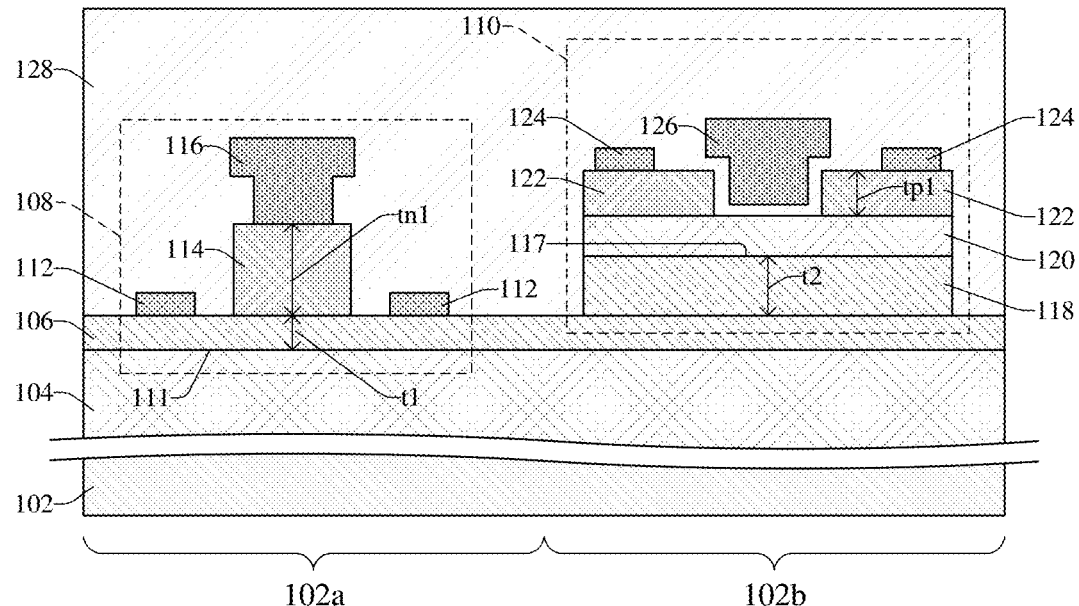
FIGS. 1A and 1B illustrate cross-sectional views of some embodiments of an integrated high electron mobility transistor (HEMT) device having an n-channel device and a p-channel device on a same substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high electron mobility transistor (HEMT) device includes a heterojunction which is at an interface between two materials having different band gaps and which acts as a channel region of the HEMT device. In an enhancement mode device (e.g., an enhancement-mode field effect transistor (E-FET)), the HEMT device uses a gate to source voltage (i.e., a threshold voltage) to switch the HEMT device "ON" (e.g., to "turn on" current between source and drain). In a depletion mode device (e.g., a depletion-mode field effect transistor (D-FET)), the HEMT device uses a gate to source voltage (i.e., a threshold voltage) to switch the device "OFF" (e.g., to "turn off" current between source and drain).

For example, in the enhancement mode for n-channel HEMT devices, the conduction band at the heterojunction has a sharp valley that drops below and intersects the Fermi level, thereby forming a two-dimensional electron gas (2DEG) at the heterojunction when a gate to source voltage is applied. In another example, in the enhancement mode for p-channel HEMT devices, the valence band at the heterojunction exhibits a peak that is above and intersects the Fermi level, thereby forming a two-dimensional hole gas (2DHG) at the heterojunction when a gate to source voltage is applied. In some applications, a p-channel HEMT device and an n-channel HEMT device are integrated onto a same substrate. However, the p-channel HEMT devices and n-channel HEMT devices have contradicting thicknesses and/or material concentrations of III-V layer(s) for optimal performance.

In some embodiments of an integrated HEMT device, a first undoped III-V layer may be disposed over a substrate, and a barrier layer may be disposed over the first undoped III-V layer. The barrier layer may comprise a III-V material such as, for example, indium aluminum gallium nitride. On an n-channel device region of the substrate, an n-channel device may be disposed, comprising, in part a second undoped III-V layer over the barrier layer and a first doped III-V layer over the second undoped III-V layer. In the enhancement mode, a desired 2DEG in the n-channel device may form along a first heterojunction at an interface between the barrier layer and the first undoped III-V layer. On a p-channel device region of the substrate laterally beside the n-channel device region, a p-channel device may be disposed, comprising, in part, a third undoped III-V layer over the barrier layer and a second doped III-V layer over the third undoped III-V layer. In the enhancement mode, a desired 2DHG in the p-channel device may form along a second heterojunction at an interface between the third undoped III-V layer and the barrier layer.

However, to optimize performance of the n-channel device, a concentration of indium and/or aluminum and a thickness of the barrier layer may be relatively low, thereby increasing depletion of the desired 2DEG and facilitating a good ohmic contact between the barrier layer and an overlying contact. In contrast, to optimize performance of the p-channel device, a concentration of indium and/or aluminum and a thickness of the barrier layer may be relatively high, thereby increasing 2DHG density (i.e., lowering sheet resistivity) and preventing leakage of 2DEG from the first heterojunction to the second heterojunction of the p-channel device. Thus, because the n-channel device and p-channel device share a same barrier layer (with a single thickness and a single concentration of indium and/or aluminum), an overall performance of the integrated HEMT device may be reduced. In addition, the first doped III-V layer of the n-channel device may be formed concurrently with the second doped III-V layer of the p-channel device, thereby decreasing cost and time associated with forming the integrated HEMT device. However, to maintain the enhancement-mode of the n-channel device, a thickness of the first doped III-V layer is relatively high. Further, a threshold voltage of the n-channel device may be set by adjusting a thickness and/or doping concentration of the first doped III-V layer. Furthermore, in order to maintain a good ohmic contact between the second doped III-V layer and an overlying contact, a thickness of the second doped III-V layer is relatively low. Thus, because the first and second doped III-V layers are formed concurrently, they may comprise a same thickness and/or doping concentration, thereby decreasing a performance of the p-channel device and/or the n-channel device.

Various embodiments of the present disclosure provide a method and corresponding structure of an integrated HEMT device that optimizes the thicknesses and/or material concentrations of III-V layers for n-channel and p-channel device performance disposed on a same substrate. In some embodiments, a lower undoped layer is formed over a substrate, a first barrier layer is formed over the lower undoped layer, and a first doped layer is formed over the first barrier layer. The first doped layer is selectively patterned, thereby defining a first doped layer of an n-channel device. Subsequently, a second barrier layer is selectively formed over the first barrier layer, an upper undoped layer is selectively formed over the second barrier layer, and a second doped layer is selectively formed over the upper undoped layer, thereby defining a stack of layers of a p-channel device. A thickness and/or material concentration of the first barrier layer and the first doped layer are formed for optimal performance of the n-channel device. Further, a thickness and/or material concentration of the second barrier layer and the second doped layer are formed for optimal performance of the p-channel device. For example, a thickness of the first barrier layer is relatively low (e.g., less than a thickness of the second barrier layer), thereby increasing depletion of the desired 2DEG and facilitating a good ohmic contact of the n-channel device. Further, a thickness of the second barrier layer is relatively high (e.g., greater than the thickness of the first barrier layer), thereby increasing 2DHG density (i.e., lowering sheet resistivity) and preventing leakage of 2DEG to the heterojunction of the p-channel device. This, in turn, increases a performance of both the n-channel device and the p-channel device disposed over the same substrate.

FIG. 1A illustrates a cross-sectional view of some embodiments of an integrated HEMT device 100a having an n-channel device 108 and a p-channel device 110.

The integrated HEMT device 100a includes a first undoped layer 104 overlying a substrate 102. In some embodiments, the first undoped layer 104 may, for example, be or comprise a binary III-V semiconductor material, such as, for example, aluminum nitride, gallium nitride, indium nitride, or the like. In further embodiments, the substrate 102 may, for example, comprise silicon, silicon carbide, sapphire, a bulk silicon substrate, a silicon-on-insulator (SOI) substrate, or another suitable semiconductor substrate material. A first barrier layer 106 overlies the first undoped layer 104. In yet further embodiments, the first barrier layer 106 may comprise a III-V semiconductor material, such as, for example, indium aluminum gallium nitride (e.g., $In_xAl_yGa_{1-x-y}N$, where x and y are within a range of 0 to 1, respectively) and/or has a thickness t1.

The n-channel device 108 is disposed within an n-channel device region 102a of the substrate 102. The n-channel device 108 may include a first doped layer 114 overlying the first barrier layer 106. First contacts 112 overlie the first barrier layer 106 and are spaced apart from one another by the first doped layer 114. In addition, a first gate electrode 116 overlies the first doped layer 114 and is disposed within a dielectric structure 128. In some embodiments, the first doped layer 114 may comprise a same material as the first undoped layer 104. However, the first doped layer 114 comprises a first doping type (e.g., p-type). In further embodiments, the first doped layer 114 may, for example, be or comprise a binary III-V semiconductor material, such as, for example, aluminum nitride, gallium nitride, indium nitride, or the like with the first doping type. Further, the first doped layer 114 has a thickness tn1 that, in some embodiments, is greater than the thickness t1 of the first barrier layer 106.

In enhancement mode, a two-dimensional electron gas (2DEG) may form along a first heterojunction 111 at an interface between the first undoped layer 104 and the first barrier layer 106. In some embodiments, the first heterojunction 111 may form due to a difference in band gap between the first undoped layer 104 and the first barrier layer 106. In some embodiments, the thickness t1 of the first barrier layer 106 is relatively thin and facilitates formation of the 2DEG along the first heterojunction 111. In some embodiments, the thickness t1 is, for example, less than about 35 nanometers, or another suitable value. In addition, formation of the 2DEG along the first heterojunction 111 may depend on the concentration of the elements within the first barrier layer 106. For example, a concentration of indium and/or aluminum within the first barrier layer 106 may be relatively low to enhance formation of the 2DEG along the first heterojunction 111. Further, by virtue of the thickness t1 and the concentration of indium and/or aluminum being relatively low in the first barrier layer 106, a good contact (e.g., an ohmic contact) may be formed between the first contacts 112 and the first barrier layer 106. In some embodiments, the thickness tn1 of the first doped layer 114 is relatively large, such that a flow and/or formation of the 2DEG along the first heterojunction 111 is increased. In addition, the thickness tn1 and/or the doping concentration of the first doping layer 114 may be adjusted to set a threshold voltage of the n-channel device 108. Thus, in some embodiments, the thickness t1 of the first barrier layer 106, the concentration of each element in the first barrier layer 106, the thickness tn1 of the first doped layer 114, and/or the doping concentration of the first doped layer 114 may be designed such that the conduction band is below the Fermi level at the interface between the first barrier layer 106 and the first doped layer 114 to form a 2DEG, while forming a good contact (e.g., an ohmic contact) with the first contacts 112. This, in part, increase a performance of the n-channel device 108.

The p-channel device 110 is disposed within a p-channel device region 102b of the substrate 102, where the p-channel device region 102b is laterally adjacent to the n-channel device region 102a. The p-channel device 110 may include a second barrier layer 118 overlying the first barrier layer 106, a second undoped layer 120 overlying the second barrier layer 118, and a second doped layer 122 overlying the second undoped layer 120. In some embodiments, the second barrier layer 118 may comprise a III-V semiconductor material, such as, for example, indium aluminum gallium nitride (e.g., $In_aAl_bGa_{1-a-b}N$, where a and b are within a range of 0 to 1, respectively) and/or has a thickness t2. In some embodiments, a+b=1, and a may be within a range of 0 to 1. In some embodiments, the thickness t1 of the first barrier layer 106 is less than the thickness t2 of the second barrier layer 118. In further embodiments, a concentration of indium and aluminum within the second barrier layer 118 is greater than a concentration of indium and aluminum within the first barrier layer 106 (e.g., a is greater than x, b is greater than y, and/or a+b is greater than x+y). Thus, in various embodiments, a concentration of elements within the second barrier layer 118 is different than a concentration of elements within the first barrier layer 106. In some embodiments, the second undoped layer 120 may, for example, be or comprise a binary III-V semiconductor material, such as, for example, aluminum nitride, gallium nitride, indium nitride, or the like. In further embodiments, the second undoped layer 120 may comprise a same material as the first undoped layer 104 and/or a thickness of the second undoped layer 120 may be less than a thickness of the first undoped layer 104. In some embodiments, the second doped layer 122 may comprise a same material as the second undoped layer 120. However, the second doped layer 122 may comprise the second doping type (e.g., p-type). In further embodiments, the second doped layer 122 may, for example, be or comprise a binary III-V semiconductor material, such as, for example, aluminum nitride, gallium nitride, indium nitride, or the like with the first doping type. In addition, the second doped layer 122 has a thickness tpl that, in some embodiments, is less than the thickness t2 of the second barrier layer 118 and/or is less than the thickness tnl of the first doped layer 114. Second contacts 124 each overlie a segment of the second doped layer 122 that are disposed on opposite sides of a second gate electrode 126. The second gate electrode 126 overlies the second undoped layer 120 and is disposed within the dielectric structure 128.

In enhancement mode, a two-dimensional hole gas (2DHG) may form along a second heterojunction 117 at an interface between the second barrier layer 118 and the second undoped layer 120. In some embodiments, the 2DHG forms because the thickness t2 of the second barrier layer 118 is substantially high thereby causing the valence band at the second heterojunction 117 to exhibit a peak that is above and intersects the Fermi level. Further, the 2DHG may form along the second heterojunction 117 because of a concentration of the elements within the second barrier layer 118. Furthermore, due to the substantially high thickness t2 of the second barrier layer 118 and/or the concentration of each element within the second barrier layer 118, a density of the 2DHG along the second heterojunction 117 is increased (thereby reducing the sheet resistance) and 2DEG from the first heterojunction 111 may be impeded from traversing the substantially thick second barrier layer 118 to the second heterojunction 117. In addition, by virtue of the thickness tpl of the second doped layer 122 being substantially thin (e.g., less than the thickness tnl of the first doped layer 114), a good contact (e.g., an ohmic contact) may be formed between the second contacts 124 and the second doped layer 122. Thus, in some embodiments, the p-channel device 110 may utilize the 2DHG along the second heterojunction 117 without interference from the 2DEG formed along the first heterojunction 111, thereby increasing a performance of the p-channel device 110. Therefore, in some embodiments, the n-channel device 108 and the p-channel device 110 may be integrated on the same substrate 102 while optimizing a performance of both devices.

Figure 1B:
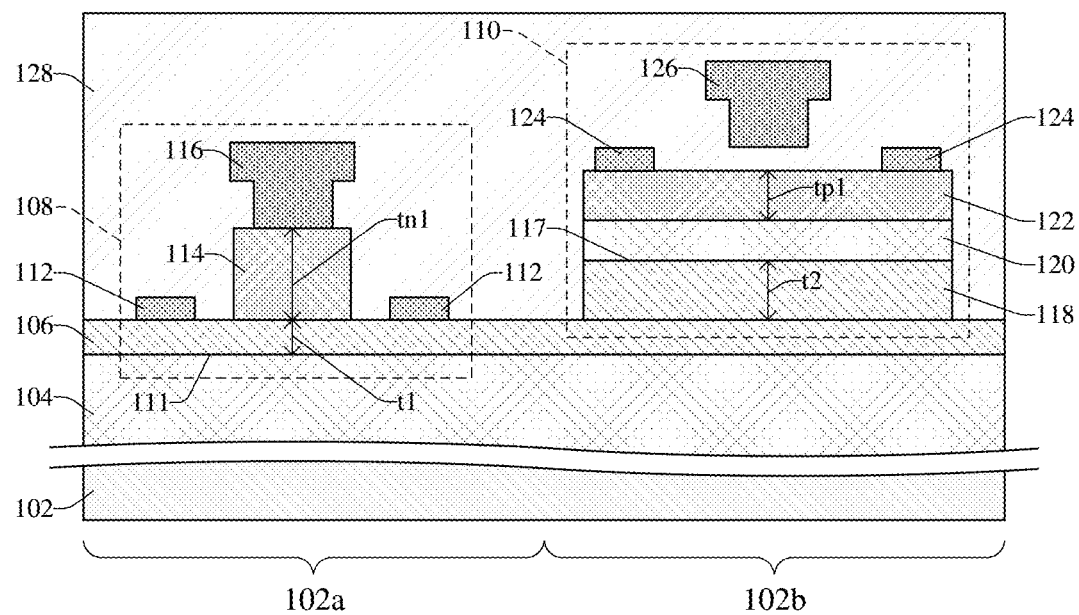

FIG. 1B illustrates a cross-sectional view of some embodiments of an integrated HEMT device 100b according to some alternative embodiments of the integrated HEMT device 100a of FIG. 1A, where the second doped layer 122 continuously extends along a top surface of the second undoped layer 120. In addition, the second gate electrode 126 is disposed above a top surface of the second doped layer 122 and is laterally between the second contacts 124. In such embodiments, the p-channel device 110 may be a depletion mode device, where a voltage (i.e., a threshold voltage) applied between the second gate electrode 126 and a contact 124 causes the p-channel device 110 to turn "OFF".

Figure 2:
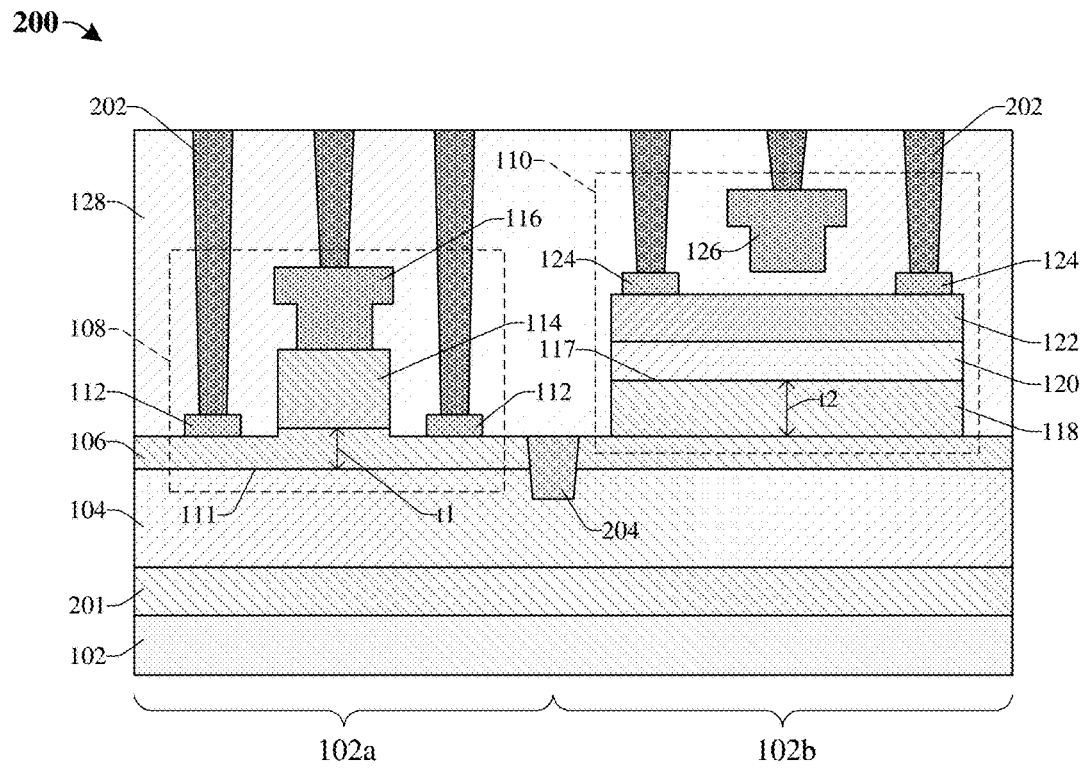
FIG. 2 illustrates a cross-sectional view of some additional embodiments of an integrated HEMT device having an n-channel device and a p-channel device on a same substrate.

FIG. 2 illustrates a cross-sectional view of some embodiments of an integrated HEMT device 200 comprising an n-channel device 108 and a p-channel device 110.

A lower buffer layer 201 is disposed between the substrate 102 and the first undoped layer 104. In some embodiments, the lower buffer layer 201 comprises a III-V semiconductor material, such as, for example, aluminum nitride, indium nitride, gallium nitride, aluminum gallium nitride, any combination of the foregoing, or the like. In further embodiments, the lower buffer layer 201 may comprise a single layer comprising the III-V semiconductor material or a multi-layer stack each comprising the III-V semiconductor material (each layer in the multi-layer stack may comprise a different III-V semiconductor material). The lower buffer layer 201 may, for example, serve to compensate for a different in lattice constants, crystalline structures, thermal expansion coefficients, or any combination of the foregoing between the substrate 102 and overlying layers (e.g., the first undoped layer 104, the first barrier layer 106, the second barrier layer 118, etc.).

The integrated HEMT device 200 includes conductive vias 202 embedded within the dielectric structure 128. In some embodiments, the dielectric structure 128 may, for example, be or comprise silicon dioxide, a low-k dielectric material, an extreme low-k dielectric material, or another suitable dielectric material. In further embodiments, the conductive vias 202 may, for example, be or comprise titanium nitride, tantalum nitride, copper, tungsten, aluminum, another suitable conductive material, or any combination of the foregoing. Each of the first contacts 112, the second contacts 124, the first gate electrode 116, and the second gate electrode 126 may be electrically coupled to one of the conductive vias 202. In further embodiments, the p-channel device 110 of the integrated HEMT device 200 may be configured as the p-channel device 110 of the integrated HEMT device 100a of FIG. 1A. The conductive vias 202 may be coupled to voltage sources to control the operation (e.g., "ON" and/or "OFF") of the n-channel device 108 and the p-channel device 110. In some embodiments, up to 20 volts may be applied across the n-channel device 108 and/or the p-channel device 110 through the conductive vias 202. In other embodiments, the voltage bias applied to the n-channel device 108 and the p-channel device 110 may be within a range of about 1 volt to 12 volts. In further embodiments, the first gate electrode 116 may be offset from the first doped layer 114 (not shown), such that the dielectric structure 128 is disposed between a bottom surface of the first gate electrode 116 and a top surface of the first doped layer 114. In further embodiments, an isolation structure 204 may be disposed within the first barrier layer 106 and the first undoped layer 104 between the n-channel device 108 and the p-channel device 110. The isolation structure 204 is configured to increase isolation between devices disposed within the n-channel device region 102a and devices disposed within the p-channel device region 102b. The isolation structure 204 may, for example, be configured as a shallow trench isolation (STI) structure, a deep trench isolation (DTI) structure, or another suitable isolation structure. In further embodiments, the isolation structure 204 may, for example, be or comprise silicon dioxide, silicon nitride, silicon carbide, another suitable dielectric material, or any combination of the foregoing.

Figure 3:
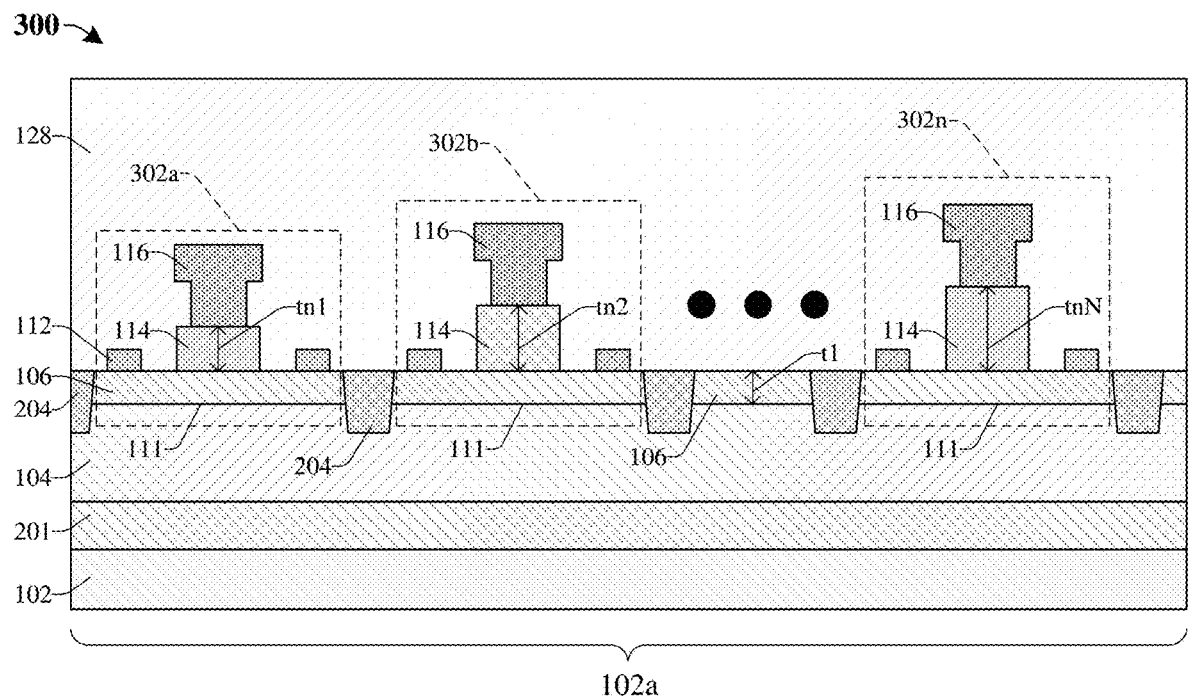
FIG. 3 illustrates a cross-sectional view of some embodiments of an HEMT device with an n-channel device region having a plurality of n-channel devices each with different threshold voltages.

FIG. 3 illustrates a cross-sectional view 300 of some embodiments of the n-channel device region 102a of FIG. 1A, 1B, or 2, where a plurality of n-channel devices 302a-n are disposed within the n-channel device region 102a. In some embodiments, the n-channel devices 302a-n may each be configured as the n-channel device 108 of FIG. 1A, 1B, or 2.

In various embodiments, the n-channel device region 102a may comprise any number of n-channel devices 302a-n. In some embodiments, an isolation structure 204 continuously laterally encloses each n-channel device 302a-n to enhance isolation between adjacent devices. Further, a thickness tn1-N of the first doped layer 114 of each n-channel device 302a-n and/or a doping concentration of the first doped layer 114 of each n-channel device 302a-n may be different from one another. A threshold voltage of each n-channel device 302a-n may be set by setting the thickness and/or doping concentration of the first doped layer 114 of each n-channel device 302a-n. In various embodiments, the n-channel devices 302a-n may be configured as enhancement mode devices or depletion mode devices. In some embodiments, the threshold voltage may be applied to each n-channel device 302a-n to control the operation (e.g., "ON" and/or "OFF") of the n-channel devices 302a-n. In some embodiments, for example, as a thickness of the first doped layer 114 of an n-channel device increases, the threshold voltage of the n-channel device increases. In further embodiments, as a doping concentration of the first doping type (e.g., p-type) in the first doped layer 114 increases, the threshold voltage of the n-channel device increases.

In various embodiments, a thickness tn1 of the first doped layer 114 of a first n-channel device 302a is less than a thickness tn2 of the first doped layer 114 of a second n-channel device 302b, and the thickness tn2 of the first doped layer 114 of the second n-channel device 302b is less than a thickness tnN of the first doped layer 114 of an $n^{th}$ n-channel device 302a. In further embodiments, a first doping concentration of the first doped layer 114 of the first n-channel device 302a is less than a second doping concentration of the first doped layer 114 of the second n-channel device 302b, and the second doping concentration of the first doped layer 114 of second n-channel device 302b is less than a third doping concentration of the first doped layer 114 of the $n^{th}$ n-channel device 302a. Thus, in some embodiments, a first threshold voltage of the first n-channel device 302a is less than a second threshold voltage of the second n-channel device 302b, and the second threshold voltage of the second n-channel device 302b is less than a third threshold voltage of the $n^{th}$ n-channel device 302a. Thus, in some embodiments, the thickness and doping concentration of the first doped layer 114 of each n-channel device 302a-n may be designed to set a threshold voltage of each n-channel device 302a-n, such that the threshold voltages are different from one another.

Figure 4:
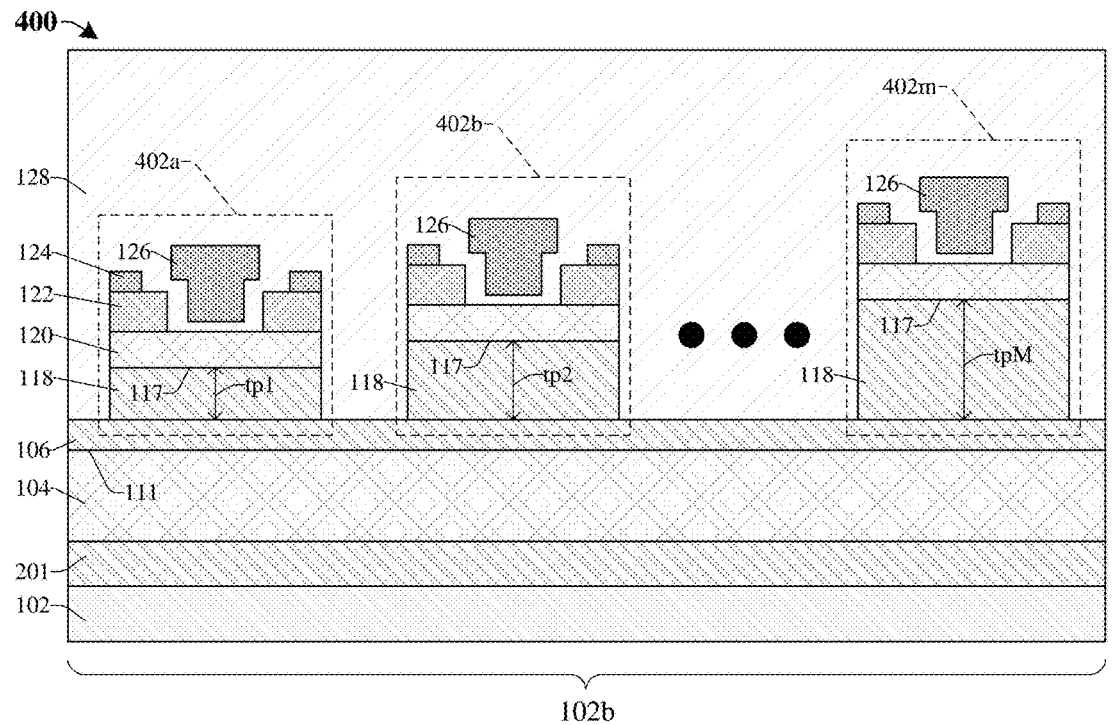
FIG. 4 illustrates a cross-sectional view of some embodiments of an HEMT device with a p-channel device region having a plurality of p-channel devices each with different threshold voltages.

FIG. 4 illustrates a cross-sectional view 400 of some embodiments of the p-channel device region 102b of FIG. 1A, 1B, or 2, where a plurality of p-channel devices 402a-m are disposed within the p-channel device region 102b. In some embodiments, the p-channel devices 402a-m may each be configured as the p-channel device 110 of FIG. 1A, 1B, or 2.

In some embodiments, the p-channel device region 102b may comprise any number of p-channel devices 402a-m. In some embodiments, a thickness tp1-M of the second barrier layer 118 of each p-channel device 402a-m and/or a concentration of elements within the second barrier layer 118 of each p-channel device 402a-m may be different from one another. A threshold voltage of each p-channel device 402a-m may be set by adjusting the thickness and/or concentration of elements of the second barrier layer 118 of each p-channel device 402a-m.

In some embodiments, the second barrier layer 118 of a first p-channel device 402a may comprise a III-V semiconductor material, such as, for example, indium aluminum gallium nitride (e.g., $In_aAl_bGa_{1-a-b}N$, where a and b are within a range of 0 to 1, respectively) with a first concentration of each element in the III-V semiconductor material. In further embodiments, the second barrier layer 118 of a second p-channel device 402b may comprise the III-V semiconductor material with a second concentration of each element in the III-V semiconductor material (e.g., $In_cAl_dGa_{1-c-d}N$, where c and d are within a range of 0 to 1, respectively). In yet further embodiments, the second barrier layer 118 of an $m^{th}$ p-channel device 402m may comprise the III-V semiconductor material with a third concentration of each element in the III-V semiconductor material (e.g., $In_eAl_fGa_{1-e-f}N$, where e and f are within a range of 0 to 1, respectively). In various embodiments, the first concentration is different from the second and/or third concentrations, and the second concentration is different from the first and/or third concentrations (e.g., a## and/or b4g). Further, in some embodiments, as the concentration of indium/aluminum increases in the second barrier layer 118 the threshold voltage of the p-channel device decreases.

In addition, in various embodiments, as the thickness tp1-M of the second barrier layer 118 decreases, the 2DHG carrier density along the second heterojunction 117 decreases, thereby increasing the threshold voltage of the p-channel device. In some embodiments, a first threshold voltage of the first p-channel device 402a is greater than a second threshold voltage of the second p-channel device 402b, and the second threshold voltage of the second p-channel device 402b is greater than the third threshold voltage of the $m^{th}$ p-channel device 402m. Thus, in some embodiments, the thickness and concentration of each element of the second barrier layer 118 of each p-channel device 402a-m may be designed to set a threshold voltage of each p-channel device 402a-m, such that the threshold voltages are different from one another. In some embodiments, as the thickness tp1-M of the second barrier layers 118 increases, isolation between the first heterojunction 111 and the second heterojunction 117 is increased.

Figure 5:
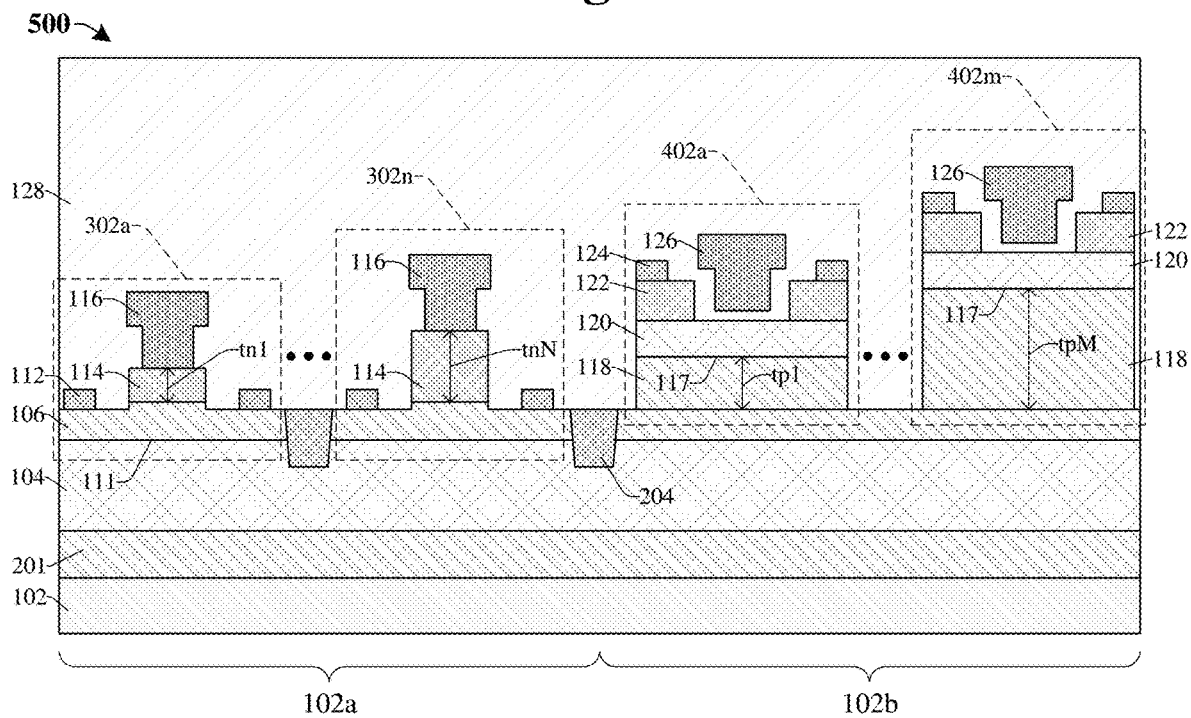
FIG. 5 illustrates a cross-sectional view of some embodiments of an integrated HEMT device having a plurality of n-channel devices laterally adjacent to a plurality of p-channel devices on a same substrate.

FIG. 5 illustrates a cross-sectional view of some embodiments of an integrated HEMT device 500 having an n-channel device region 102a laterally adjacent to a p-channel device region 102b.

In some embodiments, the n-channel device region 102a comprises a plurality of n-channel devices 302a-n. In some embodiments, the plurality of n-channel devices 302a-n are configured as illustrated and described in FIG. 3, such that the n-channel devices 302a-n may each have a threshold voltage different from one another. In further embodiments, the p-channel device region 102b comprises a plurality of p-channel devices 402a-m. In some embodiments, the plurality of p-channel devices 402a-m are configured as illustrated and described in FIG. 4, such that the p-channel devices 402a-m may each have a threshold voltage different from one another.

FIGS. 6-11 illustrate cross-sectional views 600-1100 of some embodiments of a method for forming an integrated HEMT device having an n-channel device disposed laterally adjacent to a p-channel device according to the present disclosure. Although the cross-sectional views 600-1100 shown in FIGS. 6-11 are described with reference to a method, it will be appreciated that the structures shown in FIGS. 6-11 are not limited to the method but rather may stand alone separate of the method. Although FIGS. 6-11 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 6:
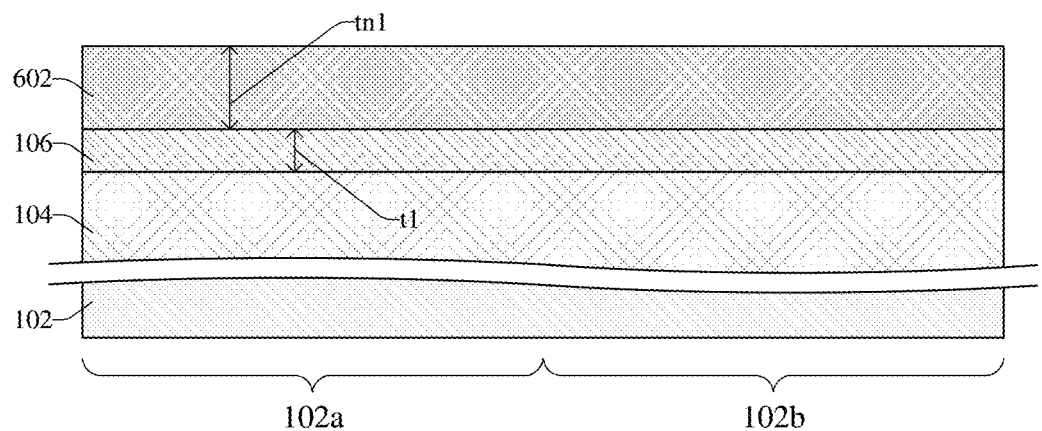
FIGS. 6-11 illustrate cross-sectional views of some embodiments of a method of forming an integrated HEMT device having an n-channel device and a p-channel device on a same substrate.

As shown in cross-sectional view 600 of FIG. 6, a substrate 102 is provided and a first undoped layer 104 is deposited over the substrate 102. In some embodiments, the substrate 102 comprises silicon, sapphire, or silicon carbide. Further, the substrate 102 may, for example, comprise a first doping type (e.g., p-type). In further embodiments, the first undoped layer 104 may, for example, be or comprise a III-V semiconductor material, or a III-N semiconductor material, such as, for example, aluminum nitride, indium nitride, gallium nitride, or the like. A first barrier layer 106 is deposited over the first undoped layer 104 with a thickness t1. In some embodiments, the first barrier layer 106 may, for example, be or comprise a III-V semiconductor material, such as, for example, indium aluminum gallium nitride (e.g., $In_xAl_yGa_{1-x-y}N$, where x and y are within a range of 0 to 1, respectively). In some embodiments, a first doped film 602 is formed over the first barrier layer 106. In further embodiments, the first doped film 602 may comprise a same material as the first undoped layer 104. However, the first doped film 602 comprises the first doping type (e.g. p-type). In further embodiments, the first doped film 602 may, for example, be or comprise a III-V semiconductor material, such as, for example, aluminum nitride, gallium nitride, indium nitride, or the like with the first doping type. Further, in some embodiments, the thickness tn1 of the first doped film 602 is greater than the thickness t1 of the first barrier layer 106.

In some embodiments, the first undoped layer 104, the first barrier layer 106, and/or the first doped film 602 may be deposited by an epitaxial process and/or another form of a deposition process (e.g., chemical vapor deposition (CVD), metal organic chemical vapor deposition (MO-CVD), plasma enhanced chemical vapor deposition (PE-CVD), atomic layer deposition (ALD), physical vapor deposition (PVD), sputtering, electron beam/thermal evaporation, etc.). In further embodiments, forming the first doped film 602 may include performing a selective ion implantation process, where dopants (e.g., boron) are selectively implanted in the first doped film 602 such that the first doped film 602 comprises the first doping type (p-type).

Figure 7:
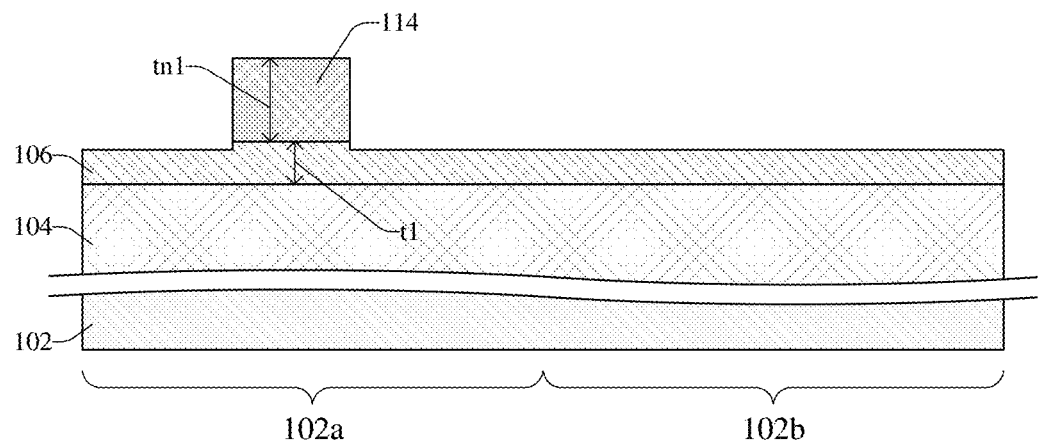

As shown in cross-sectional view 700 of FIG. 7, an etch process is performed on the first doped film (602 of FIG. 6), thereby defining a first doped layer 114 within an n-channel device region 102a of the substrate 102. In some embodiments, the first doped layer 114 has a thickness tn1 that is greater than the thickness t1 of the first barrier layer 106. In further embodiments, the etch process includes: forming a masking layer over the first doped film (602 of FIG. 6); exposing unmasking regions of the first doped film (602 of FIG. 6) to one or more etchants, thereby defining the first doped layer 114; and performing a removal process to remove the masking layer. In some embodiments, the etch process is performed in such a manner that at least a portion of the first barrier layer 106 is removed in regions laterally offset from the first doped layer 114. In such embodiments, the thickness t1 of the first barrier layer 106 directly beneath the first doped layer 114 is greater than a thickness of segments of the first barrier layer 106 that are laterally offset from the first doped layer 114. In some embodiments, the etch process may include performing a wet etch and/or a dry etch.

In yet further embodiments, another masking layer (not shown) may be formed over the first barrier layer 106 and the first doped layer 114. The another masking layer comprises an opening that exposes an upper surface of the first barrier layer 106. The opening is laterally offset from the first doped layer 114 and disposed laterally within the n-channel device region 102a. Subsequently, a selective epitaxial growth process may be performed to selectively deposit another doped layer (not shown) within the opening of the another masking layer such that the another doped layer has a greater thickness and/or greater doping concentration than the first doped layer 114. In such embodiments, the first doped layer 114 may correspond to the first doped layer 114 of the first n-channel device (302a of FIG. 3), and the another doped layer may correspond to the first doped layer 114 of the second n-channel device (302b of FIG. 3). In further embodiments, the aforementioned process may be repeated as many times as desired to form any number of doped layers (i.e., any number of n-channel devices) within the n-channel device region 102a. The selective epitaxial growth process may be an epitaxial process or another form of a deposition process (e.g., chemical vapor deposition (CVD), metal organic chemical vapor deposition (MO-CVD), plasma enhanced chemical vapor deposition (PE-CVD), atomic layer deposition (ALD), physical vapor deposition (PVD), sputtering, electron beam/thermal evaporation, etc.).

Figure 8:
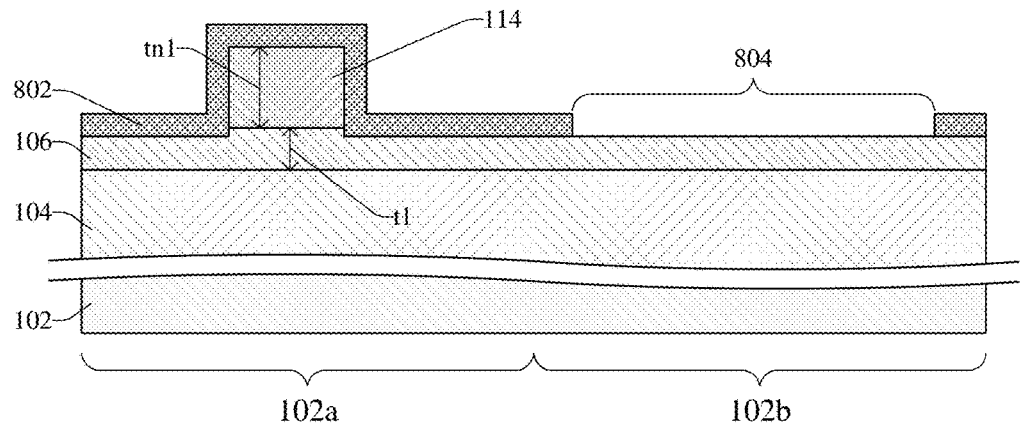

As shown in cross-sectional view 800 of FIG. 8, a masking layer 802 is formed over the n-channel device region 102a of the substrate 102 and extends over at least a portion of a p-channel device region 102b of the substrate 102. The n-channel device region 102a of the substrate 102 may be laterally beside and continuously connected to the p-channel device region 102b of the substrate 102, as the n-channel and p-channel device regions 102a, 102b are parts of the same substrate 102. The masking layer 802 comprises opposing sidewalls within the p-channel device region 102b that define an opening 804 and expose an upper surface of the first barrier layer 106. In some embodiments, the masking layer 802 may, for example, be or comprise a photosensitive material, a hard masking material, silicon nitride, silicon carbide, another suitable masking material, or any combination of the foregoing.

Figure 9:
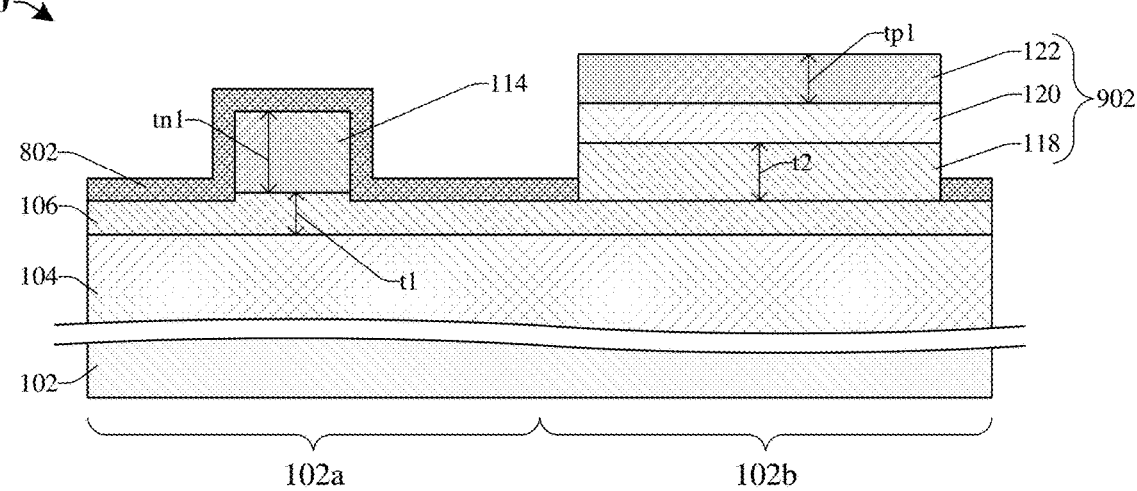

As shown in the cross-sectional view 900 of FIG. 9, a stack of layers 902 is formed over the first barrier layer 106 within the opening (804 of FIG. 8) defined by the masking layer 802. In some embodiments, the stack of layers 902 includes a second barrier layer 118 in direct contact with the first barrier layer 106, a second undoped layer 120 contacting the second barrier layer 118, and a second doped layer 122 contacting the second undoped layer 120. In further embodiments, the second barrier layer 118, the second undoped layer 120, and/or the second doped layer 122 may each be formed by a selective epitaxial growth process. The selective epitaxial growth process may be an epitaxial process or another form of a deposition process (e.g., CVD, MO-CVD, PE-CVD, ALD, PVD, sputtering, electron beam/thermal evaporation, etc.). The selective epitaxial growth process may be selective to the first barrier layer 106 and layers within the stack of layers 902, such that, for example, the second barrier layer 118 directly contacts the first barrier layer 106 because first barrier layer 106 may be a crystalline material. The selective epitaxial growth process may prevent the layers within the stack of layers 902 from forming on the masking layer 802 because the masking layer 802 is an amorphous material.

In some embodiments, the second barrier layer 118 may comprise a III-V semiconductor material, such as, for example, indium aluminum gallium nitride (e.g., $In_aAl_b Ga_{1-a-b}N$, where a and b are within a range of 0 to 1, respectively) and/or has a thickness t2. In some embodiments, the thickness t1 of the first barrier layer 106 is less than the thickness t2 of the second barrier layer 118. In further embodiments, a concentration of indium and aluminum within the second barrier layer 118 is greater than a concentration of indium and aluminum within the first barrier layer 106 (e.g., a is greater than x, b is greater than y, and/or a+b is greater than x+y). Thus, in various embodiments, a concentration of elements within the second barrier layer 118 is different than a concentration of elements within the first barrier layer 106. In some embodiments, the second undoped layer 120 may, for example, be or comprise a III-V semiconductor material, such as, for example, aluminum nitride, gallium nitride, indium nitride, or the like. In further embodiments, the second undoped layer 120 may comprise a same material as the first undoped layer 104. In some embodiments, the second doped layer 122 may comprise a same material as the second undoped layer 120. However, the second doped layer 122 may comprise the second doping type (e.g., p-type). In further embodiments, the second doped layer 122 may, for example, be or comprise a III-V semiconductor material, such as, for example, aluminum nitride, gallium nitride, indium nitride, or the like with the first doping type. In addition, the second doped layer 122 has a thickness tp1 that, in some embodiments, is less than the thickness t2 of the second barrier layer 118 and/or is less than the thickness tn1 of the first doped layer 114. In further embodiments, a removal process may be performed to remove the masking layer 802 (not shown). In further embodiments, forming the second doped layer 122 may include performing a selective ion implantation process, where dopants (e.g., boron) are selectively implanted in the second doped layer 122 such that the second doped layer 122 comprises the first doping type (p-type).

In yet further embodiments, after removing the masking layer 802, a second masking layer (not shown) may be formed over the n-channel device region 102a and the stack of layers 902. The second masking layer comprises an opening (not shown) that exposes an upper surface of the first barrier layer 106. The opening is laterally offset from the stack of layers 902 and is disposed laterally within the p-channel device region 102b. Subsequently, another stack of layers (not shown) may be formed by one or more selective epitaxial growth processes within the opening of the second masking layer, such that a second barrier layer (not shown) of the another stack of layers has a greater thickness and/or a different concentration of elements (e.g., a greater concentration of indium and/or aluminum) than the second barrier layer 118 of the stack of layers 902. In some embodiments, the stack of layers 902 may correspond to layers of the first p-channel device 402a of FIG. 4, and the another stack of layers may correspond to layers of the second p-channel device 402b of FIG. 4. In further embodiments, the aforementioned process may be repeated as many times as desired to form any number of stacks of layers (i.e., any number of p-channel devices) within the p-channel device region 102b.

Figure 10:
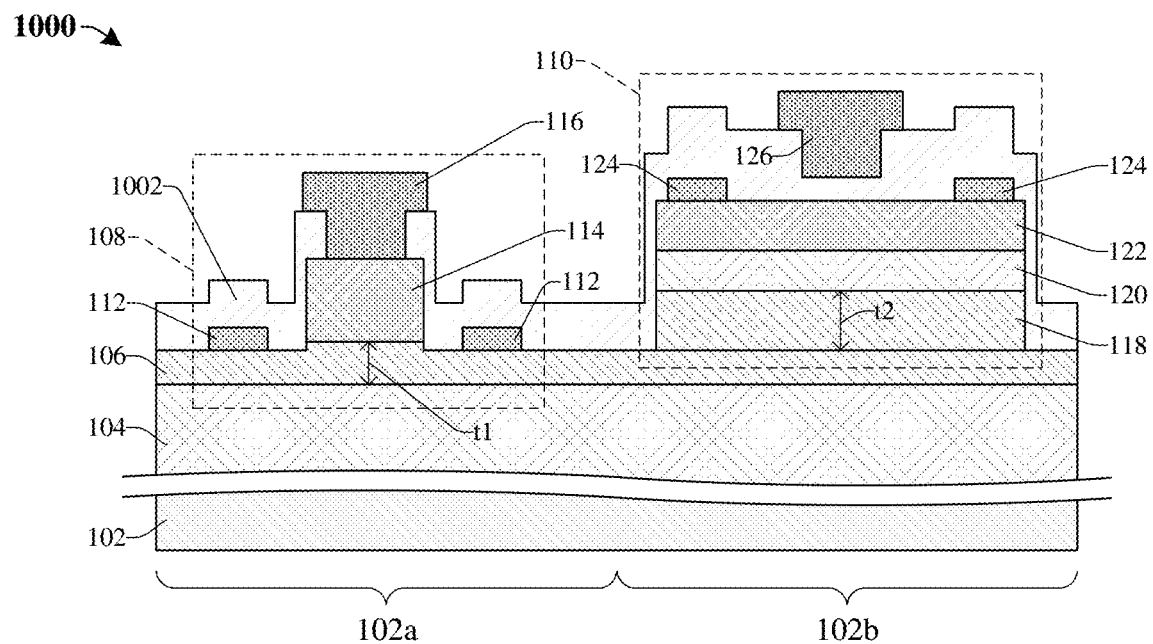

As shown in the cross-sectional view 1000 of FIG. 10, first contacts 112 are formed over the first barrier layer 106 and second contacts 124 are formed over the second doped layer 122. In some embodiments, a process for forming the first and second contacts 112 and 124 may include: depositing (e.g., by CVD, ALD, physical vapor deposition (PVD), sputtering, electroless plating, electro plating, or another suitable deposition or growth process) a conductive layer (e.g., comprising titanium, aluminum, copper, tungsten, another suitable conductive material, or any combination of the foregoing) over the n-channel and p-channel device regions 102a, 102b; forming a masking layer (not shown) over the conductive layer; patterning the conductive layer according to the masking layer, thereby defining the first and second contacts 112, 124; and performing a removal process to remove the masking layer.

Further as shown in the cross-sectional view 1000 of FIG. 10, a first gate electrode 116 is formed over the first doped layer 114 and a second gate electrode 126 is formed over the second doped layer 122, thereby defining an n-channel device 108 and a p-channel device 110, respectively. In some embodiments, a process for forming the first and second gate electrodes 116, 126 may include: forming a dielectric layer 1002 over the n-channel and p-channel device regions 102a, 102b; patterning the dielectric layer 1002 to define gate electrode openings over the first doped layer 114 and the second doped layer 122; depositing a gate layer (e.g., comprising titanium nitride, nickel, tungsten, titanium, platinum, another suitable conductive material, or any combination of the foregoing) over the dielectric layer 1002, such that the gate layer fills the gate electrode openings; and patterning the gate layer, thereby defining the first gate electrode 116 and the second gate electrode 126.

Figure 11:
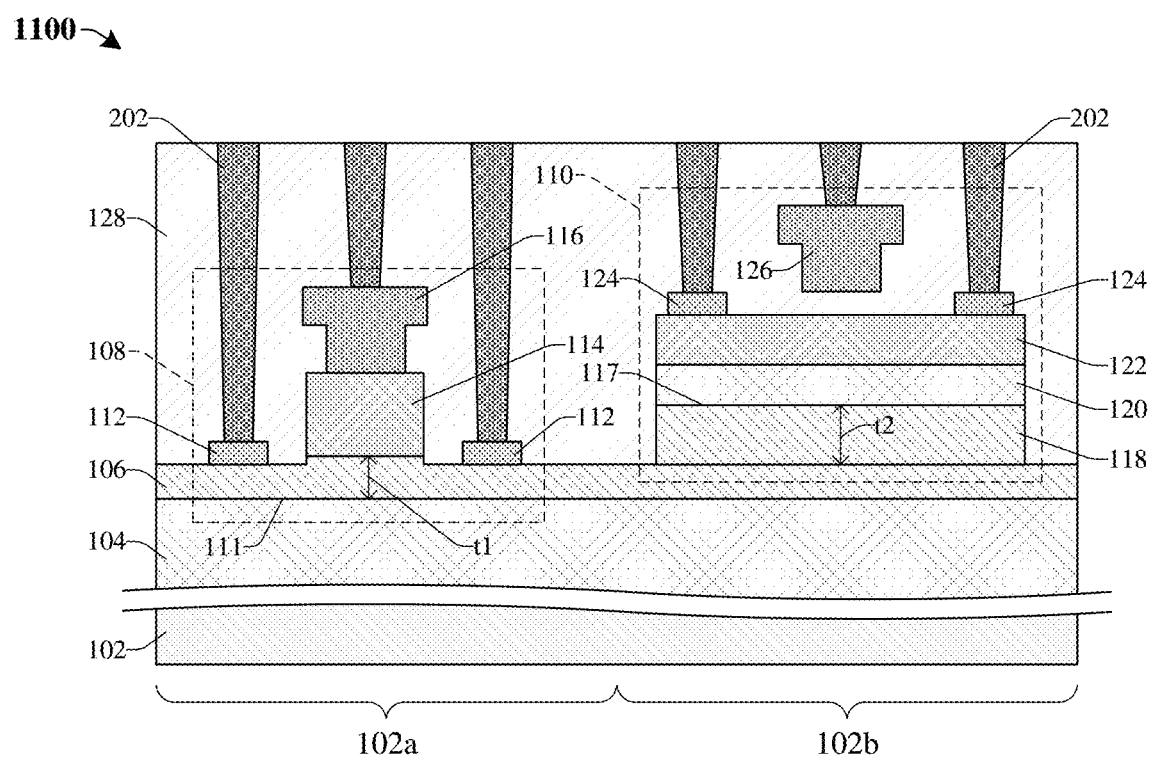

As shown in the cross-sectional view 1100 of FIG. 11, a dielectric structure 128 is formed over the n-channel device 108 and the p-channel device 110. Subsequently, a plurality of conductive vias 202 are formed within the dielectric structure 128 and over the first contacts 112, the second contacts 124, the first gate electrode 116, and the second gate electrode 126. In some embodiments, the dielectric structure 128 may, for example, be deposited by CVD, PVD, ALD, or another suitable growth or deposition process. In further embodiments, the dielectric structure 128 may, for example, be or comprise silicon dioxide, a low-k dielectric material, an extreme low-k dielectric material, or another suitable dielectric material. In further embodiments, the conductive vias 202 may be formed by a single damascene process. In addition, in various embodiments, the conductive vias 202 may, for example, be or comprise copper, aluminum, tungsten, titanium nitride, tantalum nitride, another suitable conductive material, or any combination of the foregoing. In yet further embodiments, the dielectric layer (1002 of FIG. 10) may be at least a portion of the dielectric structure 128.

Figure 12:
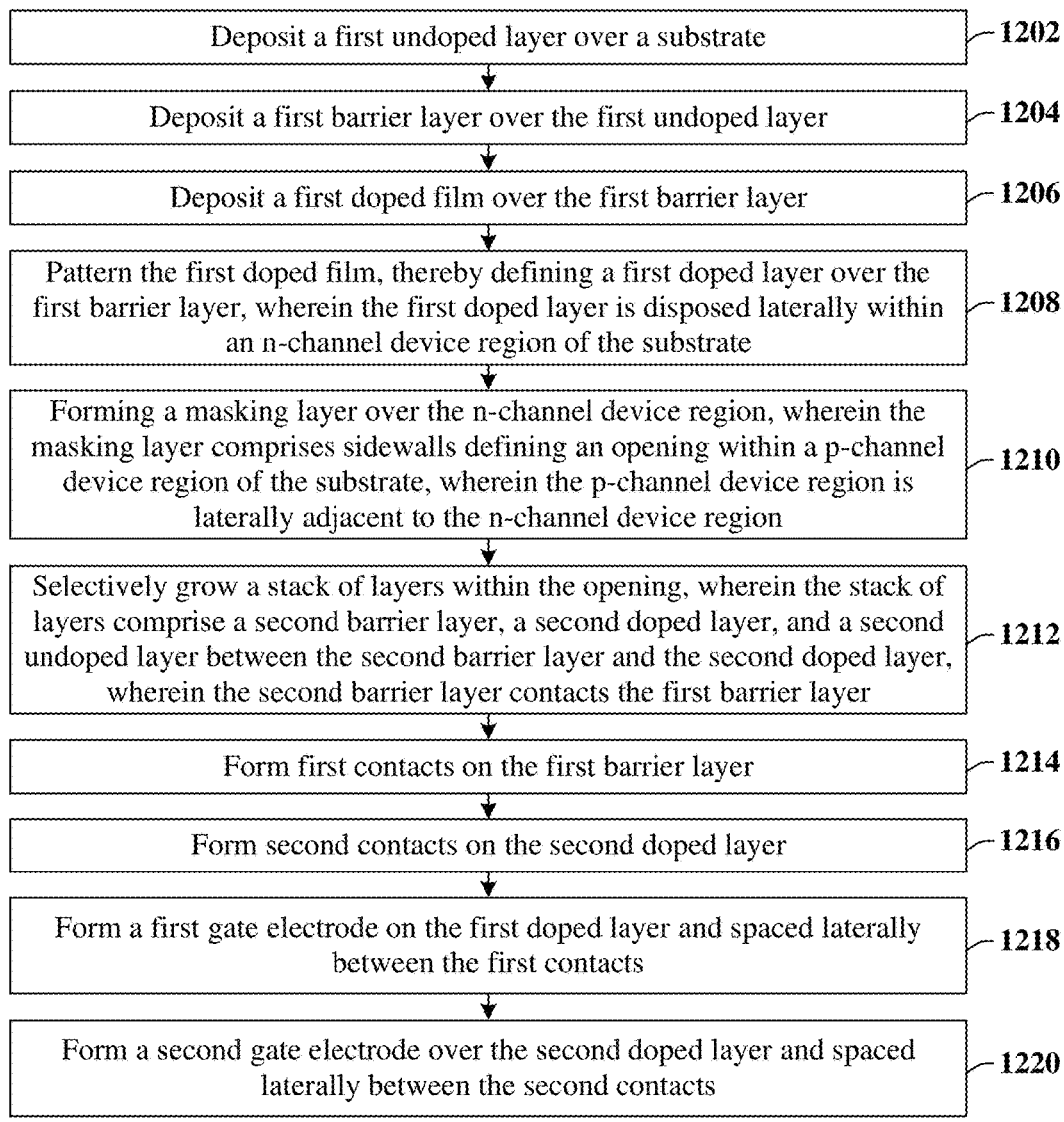
FIG. 12 illustrates a flow diagram of some embodiments corresponding to the method in FIGS. 6-11.

FIG. 12 illustrates a flow diagram of some embodiments of a method 1200 of forming an integrated HEMT device comprise an n-channel device and p-channel device on a same substrate.

While the method 1200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1202, a first undoped layer is deposited over a substrate.

At act 1204, a first barrier layer is deposited over the first undoped layer.

At act 1206, a first doped film is deposited over the first barrier layer. FIG. 6 illustrates a cross-sectional view 600 of some embodiments corresponding to acts 1202, 1204, and 1206.

At act 1208, the first doped film is patterned, thereby defining a first doped layer over the first barrier layer. The first doped layer is disposed laterally within an n-channel device region of the substrate. FIG. 7 illustrates a cross-sectional view 700 of some embodiments corresponding to act 1208.

At act 1210, a masking layer is formed over the n-channel device region, where the masking layer comprises sidewalls defining an opening within a p-channel device region of the substrate. The p-channel device region is laterally adjacent to the n-channel device region. FIG. 8 illustrates a cross-sectional view 800 of some embodiments corresponding to act 1210.

At act 1212, a stack of layers is selectively grown within the opening. The stack of layers comprise a second barrier layer, a second doped layer, and a second undoped layer between the second barrier layer and the second doped layer. The second barrier layer contacts the first barrier layer. FIG. 9 illustrates a cross-sectional view 900 of some embodiments corresponding to act 1212.

At act 1214, first contacts are formed on the first barrier layer.

At act 1216, second contacts are formed on the second doped layer.

At act 1218, a first gate electrode is formed on the first doped layer and is spaced laterally between the first contacts.

At act 1220, a second gate electrode is formed over the second doped layer and is spaced laterally between the second contacts. FIG. 10 illustrates a cross-sectional view 1000 of some embodiments corresponding to acts 1214, 1216, 1218, and 1220.

Accordingly, in some embodiments, the present disclosure relates to an integrated HEMT device comprising an n-channel device and a p-channel device on a same substrate, where the n-channel device comprises a first barrier layer and the p-channel device comprises a second barrier layer that is thicker than the first barrier layer.

In some embodiments, the present application provides an integrated chip, including: a first undoped layer overlying a substrate; a first barrier layer overlying the first undoped layer, wherein the first barrier layer has a first thickness; a first doped layer overlying the first barrier layer and disposed laterally within an n-channel device region of the substrate; a second barrier layer overlying the first barrier layer and disposed within a p-channel device region that is laterally adjacent to the n-channel device region, wherein the second barrier layer has a second thickness that is greater than the first thickness; a second undoped layer overlying the second barrier layer; and a second doped layer overlying the second undoped layer, wherein the second undoped layer and the second doped layer are disposed within the p-channel device region.

In some embodiments, the present application provides an integrated chip, including: a substrate having an n-channel device region laterally beside a p-channel device region; a first undoped layer overlying the substrate; a first n-channel device is disposed within the n-channel device region, wherein the first n-channel device includes a first barrier layer, a first doped layer, and a first gate electrode overlying the first doped layer, wherein the first doped layer contacts the first barrier layer; a first p-channel device disposed within the p-channel device region, wherein the first p-channel device includes a second barrier layer, a second undoped layer, a second doped layer, and a second gate electrode overlying the second doped layer, wherein the second barrier layer directly contacts the first barrier layer, and wherein the second undoped layer is disposed between the second barrier layer and the second doped layer; and wherein the first barrier layer comprises a III-V semiconductor material with a first concentration of elements and the second barrier layer comprises the III-V semiconductor material with a second concentration of elements different than the first concentration of elements.

In some embodiments, the present application provides a method for forming an integrated chip, the method includes: depositing a first undoped layer over a substrate, wherein the substrate comprises an n-channel device region laterally adjacent to a p-channel device region; depositing a first barrier layer over the first undoped layer; depositing a first doped film over the first barrier layer; performing a first patterning process on the first doped film to define a first doped layer within the n-channel device region, wherein the first patterning process removes the first doped film from the p-channel device region; selectively forming a stack of layers on the first barrier layer and within the p-channel device region, wherein the stack of layers comprises a second barrier layer, a second undoped layer, and a second doped layer; forming a first gate electrode over the first doped layer; and forming a second gate electrode over the second undoped layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   depositing a first undoped layer over a substrate, wherein the substrate comprises an n-channel device region laterally adjacent to a p-channel device region;
   depositing a first barrier layer over the first undoped layer, wherein the first barrier layer directly contacts the first undoped layer;
   depositing a first doped film over the first barrier layer;
   performing a first patterning process on the first doped film to define a first doped layer within the n-channel device region, wherein the first doped layer directly contacts the first barrier layer, wherein the first patterning process removes the first doped film from the p-channel device region;
   selectively forming a stack of layers on the first barrier layer and within the p-channel device region, wherein the stack of layers comprises a second barrier layer, a second undoped layer, and a second doped layer, wherein the second barrier layer directly contacts the first barrier layer;
   forming a first gate electrode over the first doped layer; and
   forming a second gate electrode over the second undoped layer.

2. The method of claim 1, wherein selectively forming the stack of layers comprises:
   forming a masking layer over the first barrier layer such that the masking layer comprises opposing sidewalls defining an opening within the p-channel device region; and
   performing one or more selective epitaxial growth processes to form the stack of layers within the opening, such that the second barrier layer directly contacts the first barrier layer.

3. The method of claim 1, further comprising:
   forming a first set of contacts on the first barrier layer and laterally spaced apart from the first gate electrode; and
   forming a second set of contacts on the second doped layer and laterally spaced apart from the second gate electrode.

4. The method of claim 1, wherein the first undoped layer comprises a binary III-V material, wherein the first and second barrier layers respectively comprise a ternary III-V material.

5. The method of claim 1, wherein after the first patterning process outer sidewalls of the first doped layer are aligned with sidewalls of the first barrier layer.

6. The method of claim 1, wherein the first barrier layer comprises a III-V semiconductor material with a first concentration of elements and the second barrier layer comprises the III-V semiconductor material with a second concentration of elements different than the first concentration of elements.

7. The method of claim 1, wherein a bottom surface of the second barrier layer is below a top surface of the first barrier layer.

8. A method for forming an integrated chip, comprising:
   depositing a first barrier layer over a substrate;
   forming a first doped layer on the first barrier layer;
   forming a masking layer over the first barrier layer and the first doped layer, wherein the masking layer comprises sidewalls defining an opening that is laterally offset from the first doped layer by a non-zero distance;
   forming a plurality of semiconductor layers on the first barrier layer and within the opening, wherein the plurality of semiconductor layers includes a second barrier layer directly contacting the first barrier layer, an undoped layer on the second barrier layer, and a second doped layer on the undoped layer; and
   wherein the first barrier layer and the second barrier layer respectively comprise a III-V semiconductor material, wherein a first concentration of elements in the III-V semiconductor material of the first barrier layer is different than a second concentration of elements in the III-V semiconductor material of the second barrier layer, wherein the second concentration of elements in the III-V semiconductor material of the second barrier layer is above a bottom surface of the first doped layer.

9. The method of claim 8, wherein a thickness of the first barrier layer is less than a thickness of the second barrier layer.

10. The method of claim 8, wherein sidewalls of the masking layer directly contact sidewalls of the second barrier layer.

11. The method of claim 8, wherein a concentration of indium and aluminum within the second barrier layer is greater than a concentration of indium and aluminum within the first barrier layer.

12. The method of claim 8, further comprising:
    removing the masking layer;
    forming a first gate electrode over the first doped layer; and
    forming a second gate electrode over the second doped layer.

13. The method of claim 12, further comprising:
    forming a first pair of contacts on the first barrier layer, wherein the first gate electrode is spaced laterally between the first pair of contacts; and
    forming a second pair of contacts on the second doped layer, wherein the second gate electrode is spacer laterally between the second pair of contacts.

14. A method for forming an integrated chip, comprising:
    depositing a first undoped layer on a substrate;
    forming a first n-channel device on the first undoped layer, wherein the first n-channel device comprises a first barrier layer directly contacting the first undoped layer, a first doped layer directly contacting the first barrier layer, and a first gate electrode over the first doped layer;
    forming a first p-channel device on the first barrier layer, wherein the first p-channel device comprises a second barrier layer directly contacting the first barrier layer, a second undoped layer on the second barrier layer, a second doped layer on the second undoped layer, and a second gate electrode over the second doped layer; and
    wherein the first barrier layer is formed to a first thickness and the second barrier layer is formed to a second thickness greater than the first thickness.

15. The method of claim 14, wherein a thickness of the first doped layer is greater than a thickness of the second doped layer and greater than the first thickness.

16. The method of claim 14, wherein the first doped layer is deposited by an epitaxial process directly on the first barrier layer and etched to a first width.

17. The method of claim 16, wherein the second doped layer and the second barrier layer are selectively deposited to a second width greater than the first width.

18. The method of claim 14, further comprising:
    forming a second n-channel device on the first undoped layer, wherein the second n-channel device comprises a segment of the first barrier layer and a third doped layer on the segment of the first barrier layer, wherein a thickness of the third doped layer is greater than a thickness of the first doped layer.

19. The method of claim 18, wherein the first doped layer has a first doping type with a first doping concentration, and wherein the third doped layer has the first doping type with a second doping concentration different than the first doping concentration.

20. The method of claim 14, wherein a top surface of the first doped layer is above a bottom surface of the second undoped layer.

* * * * *